United States Patent
Huang et al.

(10) Patent No.: US 9,633,955 B1
(45) Date of Patent: Apr. 25, 2017

(54) SEMICONDUCTOR INTEGRATED CIRCUIT STRUCTURE INCLUDING DIELECTRIC HAVING NEGATIVE THERMAL EXPANSION

(71) Applicant: UNITED MICROELECTRONICS CORP., Hsin-Chu (TW)

(72) Inventors: Jhih-Rong Huang, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/233,926

(22) Filed: Aug. 10, 2016

(51) Int. Cl.
*H01L 23/58* (2006.01)
*H01L 23/00* (2006.01)
*H01L 23/522* (2006.01)
*H01L 23/528* (2006.01)
*H01L 21/768* (2006.01)
*H01L 23/532* (2006.01)

(52) U.S. Cl.
CPC ...... *H01L 23/562* (2013.01); *H01L 21/76816* (2013.01); *H01L 21/76877* (2013.01); *H01L 23/528* (2013.01); *H01L 23/5226* (2013.01); *H01L 23/5329* (2013.01); *H01L 23/53228* (2013.01); *H01L 23/53257* (2013.01)

(58) Field of Classification Search
CPC . H01L 23/562; H01L 23/5226; H01L 23/528; H01L 23/53228; H01L 23/53257; H01L 23/5329; H01L 21/76816; H01L 21/76877
See application file for complete search history.

(56) References Cited

U.S. PATENT DOCUMENTS

| | | | |
|---|---|---|---|
| 7,556,979 B2 | 7/2009 | Hougham et al. | |
| 9,099,442 B2 | 8/2015 | Li et al. | |
| 2001/0001084 A1* | 5/2001 | Jiang | H05K 1/0271 439/161 |
| 2004/0075944 A1 | 4/2004 | Macken et al. | |
| 2015/0035150 A1 | 2/2015 | Li et al. | |

OTHER PUBLICATIONS

Cora Lind, "Two Decades of Negative Thermal Expansion Research: Where Do We Stand?", Jun. 20, 2012.
Duhee Yoon, et al., Negative Thermal Expansion Coefficient of Graphene Measured by Raman Spectroscopy, Jul. 5, 2011.

* cited by examiner

*Primary Examiner* — Matthew Gordon
(74) *Attorney, Agent, or Firm* — Winston Hsu; Scott Margo

(57) ABSTRACT

A semiconductor IC structure includes a semiconductor substrate, a multi-layered dielectric structure disposed on the semiconductor substrate, a first conductive layer disposed in the multi-layered dielectric structure, and a second conductive layer disposed on the multi-layered dielectric structure. The multi-layered dielectric structure further includes a first dielectric layer disposed on the semiconductor substrate, and a second dielectric layer disposed on the first dielectric layer. A coefficient of thermal expansion (CTE) of the first dielectric layer is larger than zero, and a CTE of the second dielectric layer is smaller than zero.

17 Claims, 5 Drawing Sheets

SEMICONDUCTOR INTEGRATED CIRCUIT STRUCTURE INCLUDING DIELECTRIC HAVING NEGATIVE THERMAL EXPANSION

BACKGROUND OF THE INVENTION

1. Field of the Invention

The invention relates to a semiconductor integrated circuit (hereinafter abbreviated as IC) structure and a method for forming the same, and more particularly, to a semiconductor IC structure including negative thermal expansion (hereinafter abbreviated as NTE) material and a method for forming the same.

2. Description of the Prior Art

Semiconductor IC structures are formed from appropriate substrates over which are formed desired semiconductor circuit elements and interconnections that include patterned conductive layers separated by dielectric layers. Also, in the course of manufacturing an IC, dielectric material is formed over the abovementioned resulting structure for purposes of providing electrical isolation and protecting the relatively fragile underlying semiconductor circuit elements.

However, it is found dielectric layers suffer cracking more than conductive layers. And cracking within dielectric layers is often attributable to physical stress onto dielectric layers. In turn, physical stress is often amplified as dimensions of the semiconductor IC structures decrease. Therefore, solution to this dielectric cracking issue is in need.

SUMMARY OF THE INVENTION

According to an aspect of the present invention, a semiconductor integrated circuit (IC) structure is provided. The semiconductor IC structure includes a semiconductor substrate, a multi-layered dielectric structure disposed on the semiconductor substrate, a first conductive layer disposed in the multi-layered dielectric structure, and a second conductive layer disposed on the multi-layered dielectric structure. The multi-layered dielectric structure further includes a first dielectric layer disposed on the semiconductor substrate, and a second dielectric layer disposed on the first dielectric layer. A coefficient of thermal expansion (hereinafter abbreviated as CTE) of the first dielectric layer is larger than zero, and a CTE of the second dielectric layer is smaller than zero.

According to an aspect of the present invention, a method for forming a semiconductor IC structure is provided. The method includes following steps. A semiconductor substrate including at least an interconnection structure formed thereon is provided. Next, a first dielectric layer is formed on the interconnection structure, and a first conductive layer is formed in the first dielectric layer. After forming the first conductive layer, a second dielectric layer is formed on the first dielectric layer and the first conductive layer. And a second conductive layer is subsequently formed on the second dielectric layer. A CTE of the second dielectric layer is smaller than a CTE of the first dielectric layer.

According to the semiconductor IC structure and the method for forming the same, the second dielectric layer including the CTE smaller than zero is formed between the first conductive layer and the second conductive layer. In other words, there is provided a negative thermal expansion (NTE) material sandwiched between the first conductive layer and the second conductive layer. Accordingly, when the two conductive layers expand in volume in response to an increase in temperature, at least the second dielectric layer contracts. And thus stresses between the conductive layers and the second dielectric layer are significantly reduced. Consequently, the dielectric cracking issue is mitigated or eliminated.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for forming a semiconductor IC structure provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 7-10 are schematic drawings illustrating a method for forming a semiconductor IC structure provided by a second preferred embodiment of the present invention, wherein FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
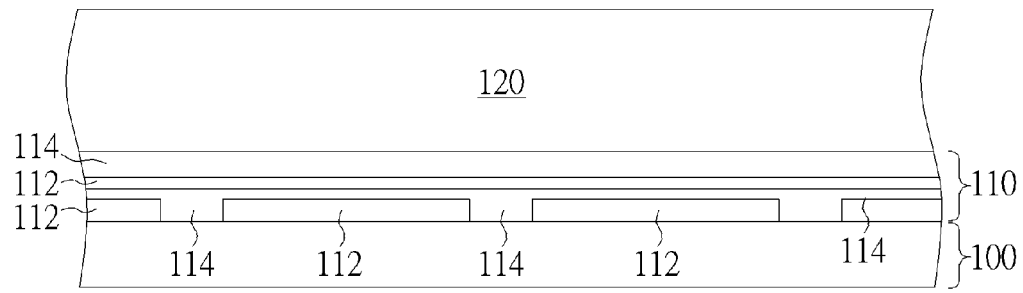

Please refer to FIGS. 1-6, which are drawings illustrating a method for forming a semiconductor IC structure provided by a first preferred embodiment of the present invention. As shown in FIG. 1, a semiconductor substrate 100 is provided, and IC(s) including a plurality of active and passive devices (not shown) can be fabricated in the semiconductor substrate 100 by front-end-of-line (hereinafter abbreviated as FEOL) process. The semiconductor substrate 100 is typically a wafer comprising multiple dies and each die includes a piece of a semiconductor material including, for example but not limited to, silicon (Si), silicon germanium (SiGe), a silicon-on-insulator (SOI) layer, and other like silicon-containing semiconductor materials. Device designs for the above mentioned active/passive devices and the details of the FEOL process are familiar to a person having ordinary skill in the art, therefore those details are all omitted in the interest of brevity.

Please refer to FIG. 1 again. The semiconductor substrate 100 further includes an interconnection structure 110 formed thereon. The interconnection structure 110 is formed on the semiconductor substrate 100 by back-end-of-line (hereinafter abbreviated as BEOL) process. The interconnection structure 110 interconnects the active/passive devices of the IC(s) and may provide circuit-to-circuit connections, or may establish contacts with input and output terminals. As shown in FIG. 1, the interconnection structure 110 includes a plurality of dielectric layers 112 such as interlayer dielectric layers or inter-metal dielectric (IMD) layers and a plurality of metal layers 114 (including wires and vias) formed in the dielectric layers 112. The dielectric layers 112 include, for example but not limited to, silicon oxide (SiO), silicon oxynitride (SiON), phosphosilicate glass (PSG), borophosphosilicate (BPSG), fluorinated silicate glass (FSG), organosilicate glasses (OSG), silicon oxycarbide (SiOC), spin-on-glass, spin-on-polymers, silicon carbon material, dielectric materials with low dielectric constant (low-k), compounds thereof, composites thereof, combinations thereof, or the like. The metal layers 114 include, also for example but not limited to tungsten (W), aluminum (Al), or copper (Cu). It is well-known to those skilled in the art that the interconnection structure 110 is formed by steps of forming one dielectric layer 112, forming recesses (not shown) in the dielectric layer 112, and filling up the recesses with metal material such as W or Cu to form the metal layers 114. These abovementioned steps can be repeated any number of times to form the stacked structure of the interconnection structure 110.

Please still refer to FIG. 1. Next, a first dielectric layer 120 is formed on the semiconductor substrate 100. Particularly, the first dielectric layer 120 is formed on the interconnection structure 110. Accordingly, the first dielectric layer 120 physically contacts the interconnection structure 110. The first dielectric layer 120 can include silicon oxide material such as, for example but not limited to, $SiO_2$, undoped silicon glass (USG), PSG, tetraethyl orthosilicate (TEOS), compounds thereof, composites thereof, combination thereof, or the like. In some embodiments of the present invention, the first dielectric layer 120 can include silicon nitride (SiN) or silicon oxynitride (SiON), but is not limited thereto. A thickness of the first dielectric layer 120 can be larger than 10000 angstroms (Å). In some embodiments of the present invention, the thickness of the first dielectric layer 120 is about, for example but not limited to, 33000 Å. In some embodiments of the present invention, the first dielectric layer 120 is a single-layered structure. Alternatively, in some embodiments of the present invention, the first dielectric layer 120 is a multi-layered structure. It is noteworthy that, a CTE of the first dielectric layer 120 is larger than zero regardless it is the single-layered structure or the multi-layered structure.

Figure 2:
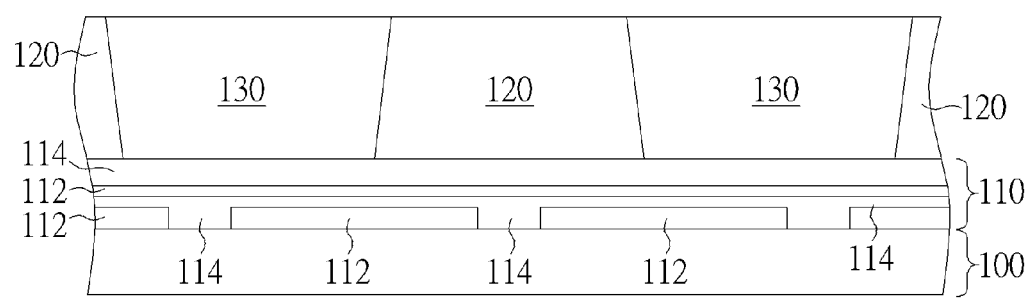

Please refer to FIG. 2. After forming the first dielectric layer 120, at least a first conductive layer 130 is formed in the first dielectric layer 120. The first conductive layer 130 can be formed by patterning the first dielectric layer 120 to form at least an opening (not shown). And a topmost metal layer of the interconnection structure 110 is exposed at a bottom of the opening. Then, sidewall and bottom of the opening are lined up with a diffusion barrier layer (not shown). The diffusion barrier layer can include titanium nitride (TiN), tantalum nitride (TaN), Ti and TiN, or Ta and TaN, but is not limited thereto. Thereafter, the openings are filled up with a conductive material such as Cu and at least a planarization process is performed to remove superfluous diffusion barrier layer and conductive material, thus the first conductive layer 130 is formed in the first dielectric layer 120 as shown in FIG. 2.

Figure 3:
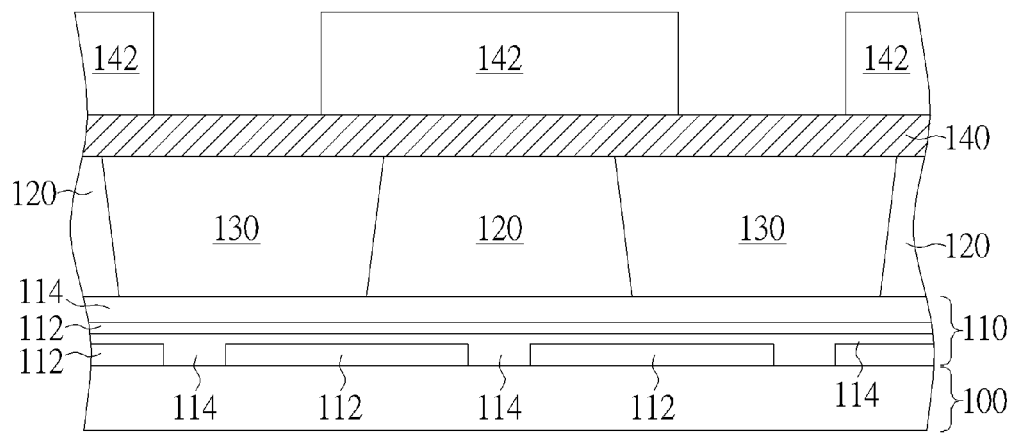

Please refer to FIG. 3. After forming the first conductive layer 130, a second dielectric layer 140 is formed on the first dielectric layer 120 and the first conductive layer 130. It is noteworthy that and a CTE of the second dielectric layer 140 is smaller than the CTE of the first dielectric layer 120. More preferably, the CTE of the second dielectric layer 140 is smaller than zero. That is, the second dielectric layer 140 includes a NTE material. As used herein, the "NTE material" refers to a material that contracts in volume in response to an increase in temperature. In some embodiments of the present invention, the second dielectric layer 140 includes $ZrW_2O_8$, $HfW_2O_8$, $ZrMo_2O_8$, $HfMo_2O_8$, $ZrV_2O_7$, $HfV_2O_7$, $Sc_2W_3O_{12}$, $Sc_2Mo_3O_{12}$, $Al_2W_3O_{12}$, or graphite, but is not limited thereto. Additionally, a thickness of the second dielectric layer 140 is smaller than the thickness of the first dielectric layer 120. In some embodiments of the present invention, the thickness of the second dielectric layer 140 can be between 7000 Å and 12000 Å, but is not limited thereto. Subsequently, a patterned hard mask 142 is formed on the second dielectric layer 140 as shown in FIG. 3. The patterned hard mask 142 is formed to define placements and size of a second conductive layer to be formed.

Figure 4:
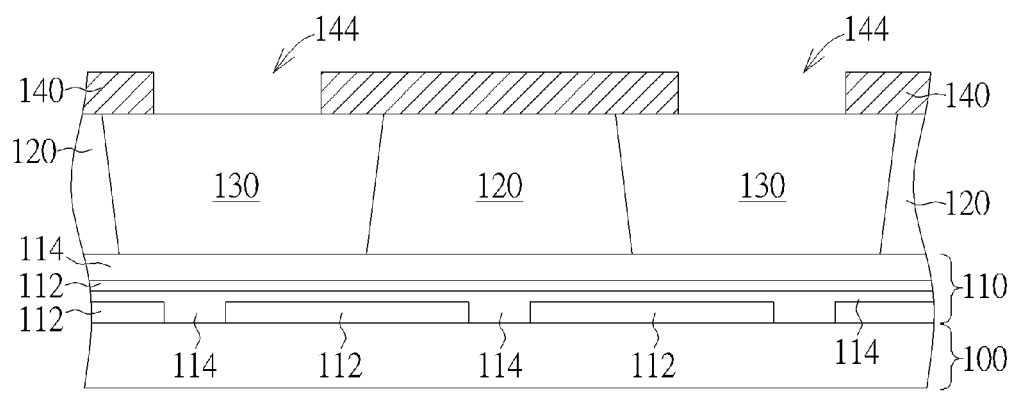

Please refer to FIG. 4. Next, the second dielectric layer 140 is etched through the patterned hard mask 142, and thus at least an opening 144 is formed in the second dielectric layer 140. The patterned hard mask 142 is then removed. As shown in FIG. 4, the first conductive layer 130 is exposed at a bottom of the opening 144. However, the second dielectric layer 140 still covers a portion of the first conductive layer 130.

Figure 5:
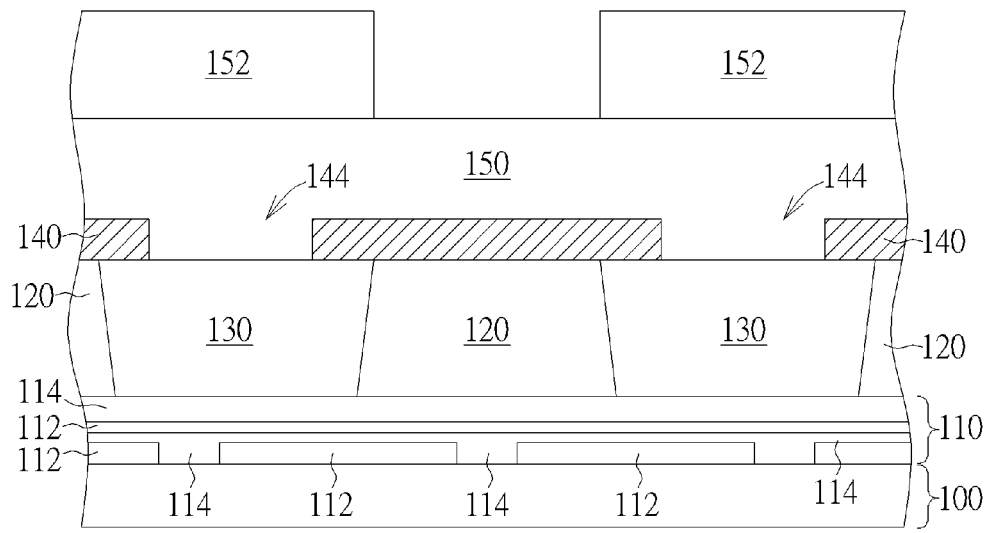

Please refer to FIG. 5. After forming the opening 144, a second conductive layer 150 is formed on the semiconductor substrate 100, particularly on the second dielectric layer 140. Therefore, the opening 144 is filled up with the second conductive layer 150. In some embodiments of present invention, the first conductive layer 130 and the second conductive layer 150 preferably include different materials. Therefore, when the first conductive layer 130 includes Cu, the second conductive layer 150 preferably includes Al, but the present invention is not limited thereto. As shown in FIG. 5, the second conductive layer 150 formed in the opening 144 physically contacts the first conductive layer 130 exposed at the bottom of the opening 144, and thus the first conductive layer 130 is electrically connected to the second conductive layer 150. Next, a patterned hard mask 152 is formed on the second conductive layer 150.

Figure 6:
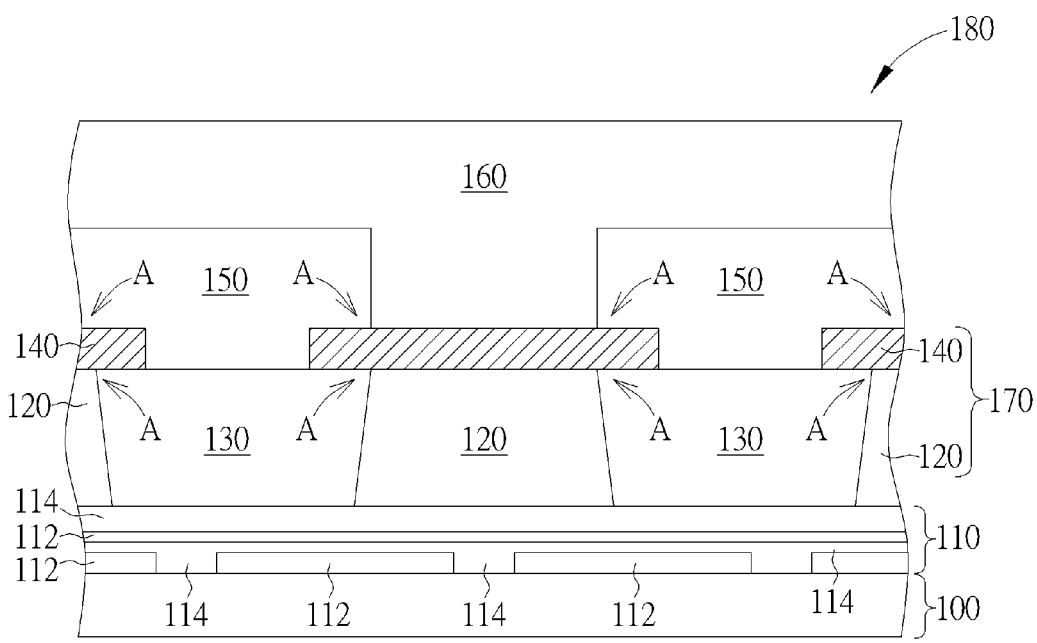

Please refer to FIG. 6. The second conductive layer 150 is then etched and patterned through the patterned hard mask 152. And the patterned hard mask 152 is subsequently removed. Thereafter, a passivation layer 160 is formed on the second conductive layer 150 and the second dielectric layer 140. The passivation layer 160 is formed to protect the second conductive layer 150 and render electrical isolation. It is well-known to those skilled in the art that the passivation layer 160 can be patterned to expose the second conductive layer 150 if electrical connection between the second conductive layer 150 and external sources/circuit is required.

Please refer to FIG. 6 again. Consequently, a semiconductor IC structure 180 is obtained. The semiconductor IC structure 180 includes the semiconductor substrate 100, a multi-layered dielectric structure 170 disposed on the semiconductor substrate 100, the first conductive layer 130 disposed in the multi-layered dielectric structure 170, and the second conductive layer 150 disposed on the multi-layered dielectric structure 170. Specifically, the multi-layered structure 170 includes the first dielectric layer 120 disposed on the semiconductor substrate 100, and the second dielectric layer 140 disposed on the first dielectric layer 120. As mentioned above, the CTE of the first dielectric layer 120 is larger than zero, and the CTE of the second dielectric layer 140 is smaller than zero. As mentioned above, the semiconductor IC structure 180 further includes the interconnection structure 110 formed on the semiconductor substrate 100, and the first conductive layer 120 and the second conductive layer 140 are electrically connected to the interconnection structure 110 as shown in FIGS. 1-6.

According to the semiconductor IC structure 180 and the method for forming the same provided by the present invention, the second dielectric layer 140, which include the NTE material is formed between the first conductive layer 130 and the second conductive layer 150. Accordingly, when the first conductive layer 130 and the second conductive layer 150 expand in volume in response to an increase in temperature, the second dielectric layer 140 contracts. And thus stresses generated from the conductive layers 130 and 150 to the second dielectric layer 140 as emphasized by the arrow A are significantly reduced. Consequently, the dielectric cracking issue is mitigated or eliminated.

Figure 7:
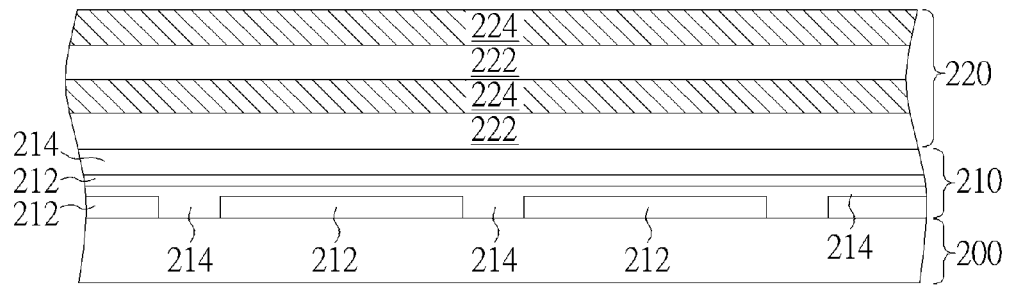

Please refer to FIGS. 7-10, which are drawings illustrating a method for forming a semiconductor IC structure provided by a second preferred embodiment of the present invention. It is noteworthy that elements the same in the first and second preferred embodiments can be formed by the same fabricating processes and thus include the same materials. Accordingly, those details are omitted hereinafter in the interest of brevity. As shown in FIG. 7, a semiconductor substrate 200 is provided, and IC (s) including a plurality of active and passive devices (not shown) can be fabricated in the semiconductor substrate 200 by FEOL process. The semiconductor substrate 200 further includes an interconnection structure 210 formed thereon. The interconnection structure 210 is formed on the substrate 200 by BEOL process. The interconnection structure 210 interconnects the active/passive devices of the IC(s) and may provide circuit-to-circuit connections, or may establish contacts with input and output terminals. As shown in FIG. 7, the interconnection structure 210 includes a plurality of dielectric layers 212 such as interlayer dielectric layers or IMD layers and a plurality of metal layers 214 (including wires and vias) formed in the dielectric layers 212. As mentioned above, the interconnection structure 210 is formed by steps of forming one dielectric layer 212, forming recesses (not shown) in the dielectric layer 212, and filling up the recesses with metal material such as W or Cu to form the metal layers 214. These abovementioned steps can be repeated any number of times to form the stacked structure of the interconnection structure 210.

Please still refer to FIG. 7. Next, a first dielectric layer 220 is formed on the substrate 210, particularly is formed on the interconnection structure 210. Accordingly, the first dielectric layer 220 contacts the interconnection structure 210. It is noteworthy that formation of the first dielectric layer 220 further includes forming a third dielectric layer 222 on the semiconductor substrate 200/the interconnection structure 210 and forming a fourth dielectric layer 224 on the third dielectric layer 222. And the step of sequentially forming the third dielectric layer 222 and the fourth dielectric layer 224 can be repeatedly performed any number of times. For example, the step of sequentially forming the third dielectric layer 222 and the fourth dielectric layer 224 can be performed twice, so that the first dielectric layer 210 include four layers constructed by two third dielectric layer 222 and two fourth dielectric layer 224 alternatively stacked. However, those skilled in the art would easily realize that the step of sequentially forming the third dielectric layer 222 and the fourth dielectric layer 224 can be performed once, thrice, four times, or even more times if required. Preferably, one of the third dielectric layer 222 contacts the semiconductor structure 200/the interconnection structure 210 as shown in FIG. 7, but is not limited thereto. Also preferably, the fourth dielectric layer 224 is made as the topmost layer of the first dielectric layer 210. More important, a CTE of the third dielectric layers 222 is larger than zero and a CTE of the fourth dielectric layers 224 is smaller than zero. Therefore, the third dielectric layer 222 can include silicon oxide material such as, for example but not limited to, SiO, USG, PSG, TEOS, low-k materials, compounds thereof, composites thereof, combination thereof, or the like. In some embodiments of the present invention, the third dielectric layer 222 can include SiN or SiON, but is not limited thereto. Furthermore, the CTE of the four dielectric layers 224 is smaller than zero, and thus includes a NTE material. In some embodiments of the present invention, the fourth dielectric layer 224 includes $ZrW_2O_8$, $HfW_2O_8$, $ZrMo_2O_8$, $HfMo_2O_8$, $ZrV_2O_7$, $HfV_2O_7$, $Sc_2W_3O_{12}$, $Sc_2Mo_3O_{12}$, $Al_2W_3O_{12}$, or graphite, but not is limited thereto. Therefore, a CTE of the first dielectric layer 220 may be larger than zero or smaller than zero. A thickness of the first dielectric layer 220 which includes the third dielectric layer (s) 222 and the four dielectric layer (s) 224 is larger than 10000 Å. In some embodiments of the present invention, the thickness of the first dielectric layer 220 is about, for example but not limited to, 33000 Å.

Figure 8:
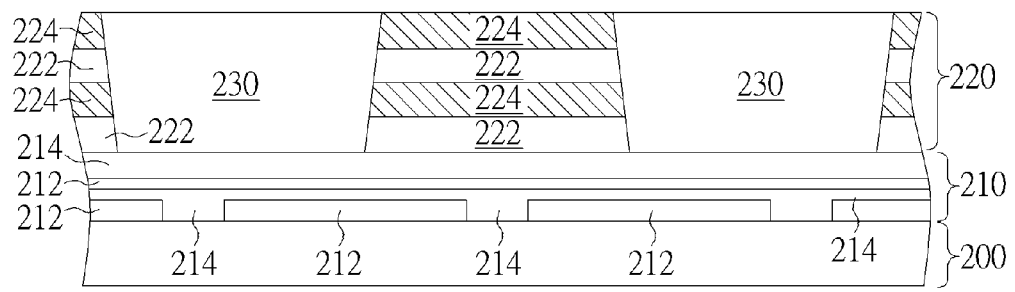
Figure 9:
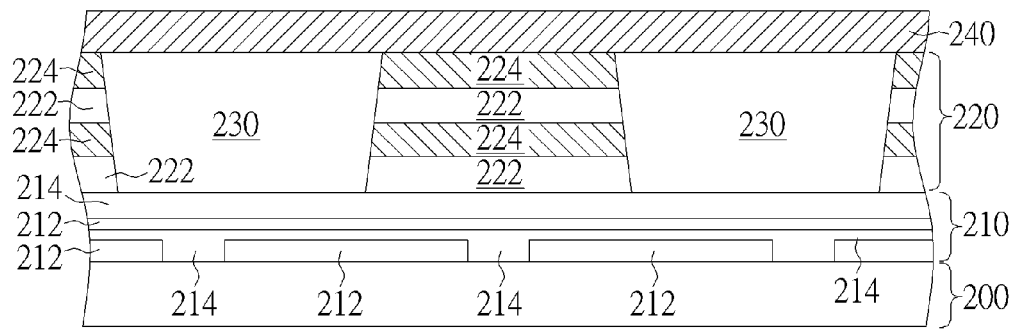

Please refer to FIG. 8. After forming the first dielectric layer 220, at least a first conductive layer 230 is formed in the first dielectric layer 220. Please refer to FIG. 9. After forming the first conductive layer 230, a second dielectric layer 240 is formed on the first dielectric layer 220 and the first conductive layer 240. It is noteworthy that and a CTE of the second dielectric layer 240 is smaller than the CTE of the first dielectric layer 220. More preferably, the CTE of the second dielectric layer 240 is smaller than zero. That is the second dielectric layer 240 includes a NTE material. In some embodiments of the present invention, the second dielectric layer 240 includes $ZrW_2O_8$, $HfW_2O_8$, $ZrMo_2O_8$, $HfMo_2O_8$, $ZrV_2O_7$, $HfV_2O_7$, $Sc_2W_3O_{12}$, $Sc_2Mo_3O_{12}$, $Al_2W_3O_{12}$, or graphite, but is not limited thereto. Additionally, a thickness of the second dielectric layer 240 is smaller than the thickness of the first dielectric layer 220. In some embodiments of the present invention, the thickness of the second dielectric layer 240 can be between 7000 Å and 12000 Å, but is not limited thereto. It is noteworthy that as mentioned above, the fourth dielectric layer 224 is preferably formed as the topmost layer of the first dielectric layer 220, therefore one of the fourth dielectric layer 224 contacts the second dielectric layer 240. Since both of the fourth dielectric layer 224 and the second dielectric layer 240 include the NTE material, adhesion between the second dielectric layer 240 and the fourth dielectric layer 224 is improved.

Figure 10:
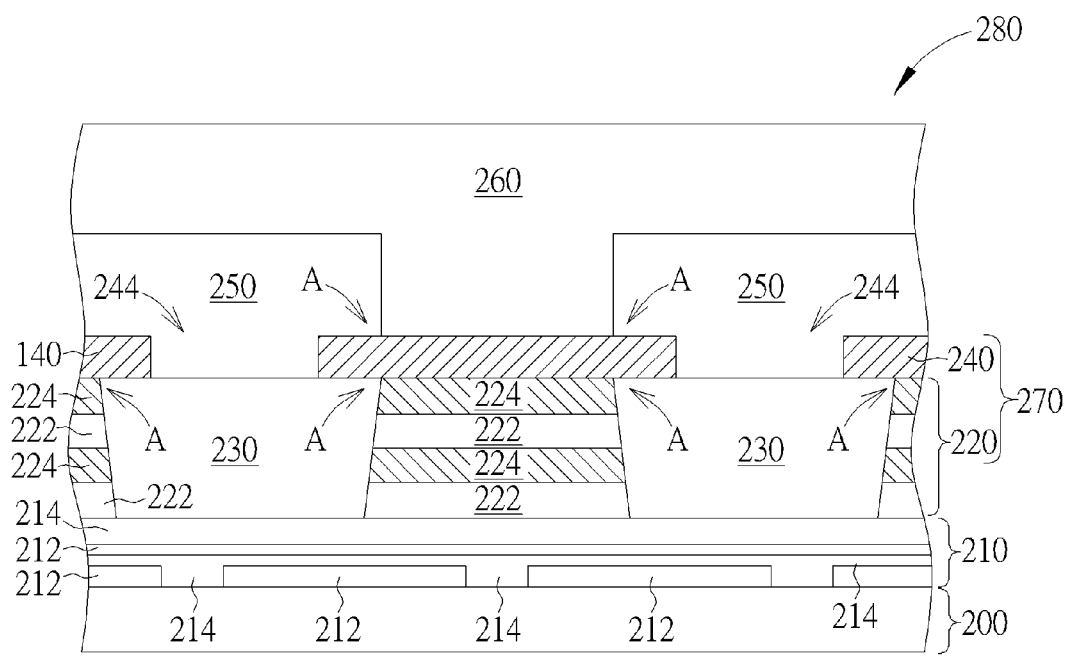

Please refer to FIG. 10. Next, the second dielectric layer 240 is etched to format least an opening 244, and the first conductive layer 230 is exposed at a bottom of the opening 244. However, the second dielectric layer 240 still covers a portion of the first conductive layer 230. After forming the opening 244, a second conductive layer 250 is formed on the semiconductor substrate 200, particularly on the second dielectric layer 240 and followed by patterning. As mentioned above, the first conductive layer 230 and the second conductive layer 250 preferably include different materials. Therefore, when the first conductive layer 230 includes Cu, the second conductive layer 250 preferably includes Al, but the present invention is not limited thereto. As shown in FIG. 10, the second conductive layer 250 formed in the opening 244 physically contacts the first conductive layer 230 exposed at the bottom of the opening 244, and thus the first conductive layer 230 is electrically connected to the second conductive layer 250. Thereafter, a passivation layer 260 is formed on the second conductive layer 250 and the second dielectric layer 240. The passivation layer 260 is formed to protect the second conductive layer 250 and render electrical isolation. It is well-known to those skilled in the art that the passivation layer 260 can be patterned to expose the second conductive layer 250 if electrical connection between the second conductive layer 250 and external sources/circuit is required.

Please refer to FIG. 10 again. Consequently, a semiconductor IC structure 280 is obtained. The semiconductor IC structure 280 includes the semiconductor substrate 200, a multi-layered dielectric structure 270 disposed on the semiconductor substrate 200, the first conductive layer 230 disposed in the multi-layered dielectric structure 270, and the second conductive layer 250 disposed on the multi-layered dielectric structure 270. Specifically, the multi-layered structure 270 includes the first dielectric layer 220 disposed on the semiconductor substrate 200, and the second dielectric layer 240 disposed on the first dielectric layer 220. And the first dielectric layer 220 itself includes the third dielectric layers 222 and the fourth dielectric layers 224 alternatively stacked. As mentioned above, since the first dielectric layer 220 includes the third dielectric layers 222 with the positive CTE and the fourth dielectric layers 224 with the negative CTE, the CTE of the first dielectric layer 220 may be positive or negative. The CTE of the second dielectric layer 240 is smaller than zero. More important, the CTE of the second dielectric layer 240 is smaller than the CTE of the first dielectric layer 220.

According to the semiconductor IC structure 280 and the method for forming the same provided by the present invention, the second dielectric layer 240 and the fourth dielectric layer 224, which both include the NTE material is formed in between the first conductive layer 230 and the second conductive layer 250. Particularly, the NTE material surrounds the interface between the first conductive layer 230 and the second conductive layer 250 as shown in FIG. 10. Therefore, when the first conductive layer 230 and the second conductive layer 250 expand in volume in response to an increase in temperature, the second dielectric layer 240 and the fourth dielectric layer 224 contracts. And thus stresses generated from the conductive layers 230 and 250 to the dielectric layers 240 and 224 emphasized by the arrow A are significantly reduced. Consequently, the dielectric cracking issue is mitigated or eliminated.

According to the semiconductor IC structure and the method for forming the same, the dielectric layer(s) including the negative CTE is formed between the first conductive layer and the second conductive layer. In other words, there is provided a NTE material sandwiched between the first conductive layer and the second conductive layer. Accordingly, when the two conductive layers expand in volume in response to an increase in temperature, the dielectric layer(s) contracts. And thus stresses between the conductive layers and the dielectric layer(s) are significantly reduced. Consequently, the dielectric cracking issue is mitigated or eliminated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor integrated circuit (IC) structure comprising:
   a semiconductor substrate;
   a multi-layered dielectric structure disposed on the semiconductor substrate, and the multi-layered dielectric structure comprising:
      a first dielectric layer disposed on the semiconductor substrate, and a coefficient of thermal expansion (CTE) of the first dielectric layer being larger than zero, wherein the first dielectric layer further comprises a plurality of third dielectric layers and a plurality of fourth dielectric layers alternatively stacked on the semiconductor substrate; and
      a second dielectric layer disposed on the first dielectric layer, and a CTE of the second dielectric layer being smaller than zero;
   a first conductive layer disposed in the multi-layered dielectric structure; and
   a second conductive layer disposed on the multi-layered dielectric structure.

2. The semiconductor IC structure according to claim 1, wherein the first conductive layer and the second conductive layer comprise different materials.

3. The semiconductor IC structure according to claim 1, wherein the first conductive layer is electrically connected to the second conductive layer.

4. The semiconductor IC structure according to claim 1, wherein the second dielectric layer comprises $ZrW_2O_8$, $HfW_2O_8$, $ZrMo_2O_8$, $HfMo_2O_8$, $ZrV_2O_7$, $HfV_2O_7$, $Sc_2W_3O_{12}$, $Sc_2Mo_3O_{12}$, $Al_2W_3O_{12}$, or graphite.

5. The semiconductor IC structure according to claim 1, wherein the second dielectric layer covers a portion of the first conductive layer.

6. The semiconductor IC structure according to claim 1, wherein a CTE of the third dielectric layers is larger than zero and a CTE of the fourth dielectric layers is smaller than zero.

7. The semiconductor IC structure according to claim 6, wherein one of the third dielectric layers contacts the semiconductor substrate, and one of the fourth dielectric layers contacts the second dielectric layer.

8. The semiconductor IC structure according to claim 1, wherein the first conductive layer and the second conductive layer are electrically connected to an interconnection structure formed on the semiconductor substrate.

9. The semiconductor IC structure according to claim 8, wherein the first dielectric layer contacts the interconnection structure.

10. A method for forming a semiconductor integrated circuit (IC) structure, comprising:
    providing a semiconductor substrate comprising at least an interconnection structure formed thereon;
    forming a first dielectric layer on the interconnection structure, further comprising:
       forming a third dielectric layer on the interconnection structure, and a CTE of the third dielectric layer being larger than zero; and
       forming a fourth dielectric layer on the third dielectric layer, and a CTE of the fourth dielectric layer being smaller than zero;
    forming a first conductive layer in the first dielectric layer;
    forming a second dielectric layer on the first dielectric layer and the first conductive layer, wherein a CTE of the first dielectric layer is larger than zero and a CTE of the second dielectric layer is smaller than zero; and
    forming a second conductive layer on the second dielectric layer.

11. The method for forming the semiconductor IC structure according to claim 10, wherein the first conductive layer and the second conductive layer comprise different materials.

12. The method for forming the semiconductor IC structure according to claim 10, wherein the first conductive layer is electrically connected to the second conductive layer.

13. The method for forming the semiconductor IC structure according to claim 10, wherein the second dielectric layer comprise $ZrW_2O_8$, $HfW_2O_8$, $ZrMo_2O_8$, $HfMo_2O_8$, $ZrV_2O_7$, $HfV_2O_7$, $Sc_2W_3O_{12}$, $Sc_2Mo_3O_{12}$, $Al_2W_3O_{12}$, or graphite.

14. The method for forming the semiconductor IC structure according to claim 10, wherein the first dielectric layer contacts the interconnection structure.

15. The method for forming the semiconductor IC structure according to claim 10, wherein the second dielectric layer covers a portion of the first conductive layer.

16. The method for forming the semiconductor IC structure according to claim 10, wherein the steps of forming the third dielectric layer and forming the fourth dielectric layer are repeatedly performed.

17. The method for forming the semiconductor IC structure according to claim 16, wherein one of the third dielectric layers contacts the semiconductor substrate, and one of the fourth dielectric layers contacts the second dielectric layer.

* * * * *